(12) United States Patent
Yukimoto et al.

(10) Patent No.: US 7,112,824 B2
(45) Date of Patent: Sep. 26, 2006

(54) LIGHT-EMITTING DIODE ARRAY

(75) Inventors: Tomihisa Yukimoto, Hitachi (JP); Eiichi Kunitake, Hitachi (JP); Yukio Sasaki, Takahagi (JP)

(73) Assignee: Hitachi Cable, Ltd., Tokyo (JP)

( * ) Notice: Subject to any disclaimer, the term of this patent is extended or adjusted under 35 U.S.C. 154(b) by 104 days.

(21) Appl. No.: 11/002,065

(22) Filed: Dec. 3, 2004

(65) Prior Publication Data

US 2005/0269579 A1   Dec. 8, 2005

(30) Foreign Application Priority Data

Jun. 4, 2004   (JP) ............................. 2004-167584

(51) Int. Cl.
*H01L 33/00* (2006.01)
*B41J 2/45* (2006.01)

(52) U.S. Cl. ............................. 257/99; 257/93; 257/98; 257/E33.066; 347/238

(58) Field of Classification Search ................. 257/93, 257/98–99, E33.066; 347/238
See application file for complete search history.

(56) References Cited

U.S. PATENT DOCUMENTS

| 5,955,747 | A  | * | 9/1999  | Ogihara et al.  | 257/88    |
|-----------|----|---|---------|-----------------|-----------|
| 6,172,701 | B1 | * | 1/2001  | Tokura et al.   | 347/237   |
| 6,190,935 | B1 | * | 2/2001  | Ogihara et al.  | 438/34    |
| 6,388,696 | B1 | * | 5/2002  | Taninaka et al. | 347/238   |
| 6,563,138 | B1 | * | 5/2003  | Ogihara et al.  | 257/88    |
| 2001/0007359 | A1 | * | 7/2001  | Ogihara et al.  | 257/88    |
| 2002/0153846 | A1 | * | 10/2002 | Taninaka et al. | 315/169.3 |
| 2005/0029529 | A1 | * | 2/2005  | Yukimoto et al. | 257/79    |

OTHER PUBLICATIONS

Oki Technical Reviews, No. 189, vol. 69 (No. 1), pp. 70-73, Jan. 2002.

* cited by examiner

*Primary Examiner*—Shouxiang Hu
(74) *Attorney, Agent, or Firm*—Sughrue Mion, PLLC

(57) ABSTRACT

A light-emitting diode array comprising a conductive layer formed on a substrate, pluralities of separate light-emitting portions formed on the conductive layer, a first groove formed in the conductive layer to divide the light-emitting portions to blocks, first electrodes each formed on at least part of an upper surface of each light-emitting portion, one second electrode formed directly on the conductive layer in each block, common switching wirings separately connected to the first electrodes, first bonding pads each connected to each common wiring, first bonding pads each connected to each common wiring, and second bonding pads each connected to each second electrode, n light-emitting portions (n is an even number) being arranged transversely in each block, and second grooves being formed in the conductive layer between adjacent light-emitting portions such that the second grooves are arranged short and long alternately, with the nearest one to the first groove being short.

6 Claims, 11 Drawing Sheets

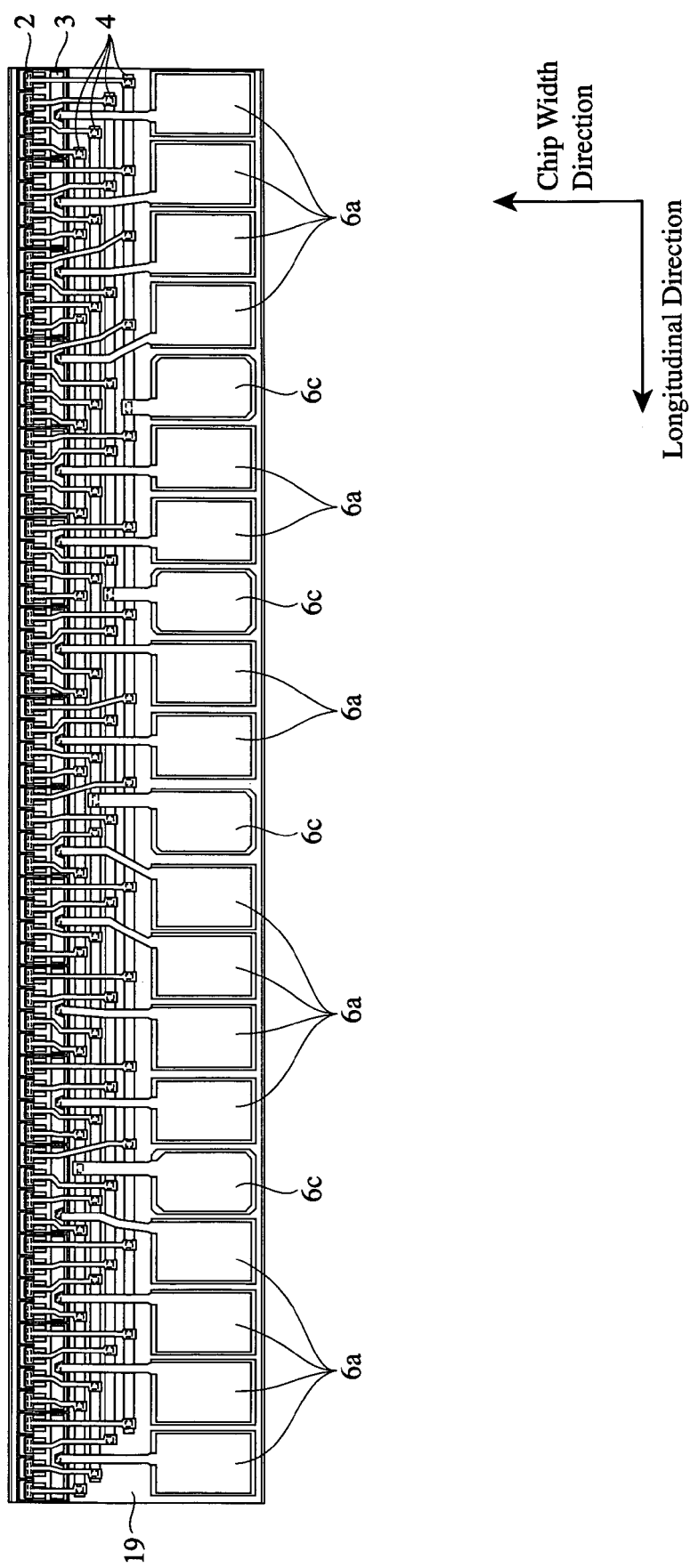

LIGHT-EMITTING DIODE ARRAY

FIELD OF THE INVENTION

The present invention relates to a light-emitting diode array having a high, uniform light output, and particularly to a light-emitting diode array suitable for light sources of electrophotographic printers, etc.

BACKGROUND OF THE INVENTION

An electrophotographic printer forms an electrostatic latent image on a photosensitive drum by light according to an image signal, develops the latent image by selectively attracting toner thereto, and then transfers the developed image onto a paper to obtain a print image. As a light source for forming the electrostatic latent image, a laser and a light-emitting diode array are widely used. In particular, since a light source constituted by the light-emitting diode array does not need a long optical path unlike the laser-type light source, it is suitable for small-sized printers. Because the light-emitting diode array can be laterally long, it is also suitable for large-sized printing. Demand has recently been mounting on light-emitting diode arrays of higher precision, higher light output and lower in cost, as printing has been becoming faster with higher image quality, and as printers have been becoming smaller.

To achieve the reduction of the cost of light-emitting diode array heads, it is advantageous to replace a static driving system comprising ICs for separately driving light-emitting diodes, with a dynamic driving system or a matrix driving system, which comprises pluralities of light-emitting diodes in a block, and a switching matrix wiring subjected to time division operation, thereby reducing the number of driving ICs and bonding wires (see "Oki Technical Review," Vol. 69, No. 1, January, 2002, Ser. No. 189).

In view of the above circumstances, the inventors have proposed a light-emitting diode array of a partitioned-matrix, dynamic driving system with the number of bonding pads reduced by connecting first bonding pads to first electrodes via common wirings such that the ratio of the number of the first bonding pads connected to the first electrodes to the number of the second bonding pads connected to the second electrodes is 1:n (n 3) (Japanese patent application No. 2003-289909 corresponding to U.S. Ser. No. 10/910,658). FIG. 7 is a top view showing a light-emitting diode array of a four-partitioned matrix driving system having such a structure. In this example, one cell is composed of 64 dots of light-emitting portions. Bonding pads 6c, which are connected to first electrodes (cathodes) 2 via common switching wirings 4, and bonding pads 6a, which are connected to second electrodes (anodes) 3, are arranged in such a row that the ratio of the number of the bonding pads 6c to the number of the bonding pads 6a is 1:4.

FIG. 8 is an enlarged top view showing part of the light-emitting diode array shown in FIG. 7. FIG. 9(*a*) is a cross-sectional view taken along the line C—C in FIG. 8, FIG. 9(*b*) is a cross-sectional view taken along the line D—D in FIG. 8, and FIG. 9(*c*) is a cross-sectional view taken along the line E—E in FIG. 8. This light-emitting diode array comprises a substrate 10, a conductive layer 11 formed on the substrate 10, pluralities of light-emitting portions 1 formed on the conductive layer 11, cathodes 2 each formed on an upper surface of each light-emitting portion 1, anodes 3 formed on the conductive layer 11, four common wirings 4 separately connected to the cathodes 2 via lead wires 5c, bonding pads 6c separately connected to the common wirings 4, and bonding pads 6a separately connected to anodes 3 via lead wires 5a. As shown in FIG. 8, the light-emitting portions 1 are partitioned by a first rectangular groove 20 formed in the conductive layer 11 to blocks such that each block comprises four light-emitting portions 1.

FIG. 10 is a top view showing a straight current 26a as a driving current and a sneak current 26b both flowing to the light-emitting portions 1 in one block of this light-emitting diode array. FIG. 11 is a top view showing the light-emitting portion 1 and its surroundings. The cathode 2 formed on the upper surface of the light-emitting portion 1 is in a T shape comprising a connection portion 2a extending from an end (on the farther side from the anode 3) substantially in the width of the light-emitting portion 1, and an elongated portion 2b extending from the connection portion 2a on a center portion of the light-extracting portion 9. Accordingly, not only a straight current 26a flowing from the anode 3 immediately below the light-emitting portion 1 but also a sneak current 26b can be guided to a region immediately below the light-extracting portion 9.

Light output can be improved by adjusting the width of the light-extracting portion 9 and the length of the cathode 2. FIGS. 12(*a*) and 12(*b*) show the relation between the length L of the connection portion 2a of the cathode 2, and light output and driving voltage, respectively. As shown in FIGS. 12(*a*) and 12(*b*), by setting the length L of the connection portion 2a to 20 μm or less, the light output can be drastically improved while suppressing a driving voltage. The extension portion 2b of the cathode 2 may have a shape comprising pluralities of stripes, networks, etc., as long as fine working is possible.

The second grooves 121 formed on the conductive layer 11 in each block substantially extend from a side (on the farthest side from the anode 3) of the first groove 20 to ends (on the farthest side from the anode 3) of the light-extracting portions 9 between the adjacent light-emitting portions 1. The second grooves 121 suppress those having no contribution to light emission among the sneak current, so that those having contribution to light emission (sneak current 26b) can flow immediately below the light-extracting portion 9 at a high efficiency. This increases the light output, enabling low-voltage driving.

However, the sneak current 26b flows from one side to the light-emitting portion 1a adjacent to the first groove 20, while the sneak current 26b flows from both sides to the light-emitting portion 1b, which is not adjacent to the first groove 20. Accordingly, the amounts of current flowing to the light-emitting portions 1a and 1b are different from each other.

FIG. 13(*a*) shows an example of the light output of each light-emitting portion 1 in a block, and FIG. 13(*b*) shows an example of the driving voltage of each light-emitting portion 1 in a block. As is clear from FIGS. 13(*a*) and 13(*b*), the light output and driving voltage of light-emitting portions 1 are relatively uneven in each block.

OBJECT OF THE INVENTION

Accordingly, an object of the present invention is to provide a light-emitting diode array of a matrix driving system, in which a uniform amount of a sneak current flows into light-emitting portions in each block, whereby the light-emitting portions in each block provide uniform light output and driving voltage.

DISCLOSURE OF THE INVENTION

As a result of intense research in view of the above object, the inventors have found that (a) when grooves with the same length are formed in a conductive layer between light-emitting portions in each block in a light-emitting diode array of a matrix driving system, a non-uniform sneak current flows into each light-emitting portion, so that each light-emitting portion provides non-uniform light output and driving voltage, and that (b) this problem can be solved by adjusting the length of the grooves. The present invention has been completed based on this finding.

Thus, the light-emitting diode array of the present invention comprises a conductive layer formed on a substrate, pluralities of separate light-emitting portions formed on the conductive layer, a first groove formed in the conductive layer to divide the light-emitting portions to blocks, first electrodes each formed on at least part of an upper surface of each light-emitting portion, a second electrode formed directly on the conductive layer in each block, common switching wirings separately connected to the first electrodes, first bonding pads each connected to each common wiring, and second bonding pads each connected to each second electrode, n light-emitting portions (n is an even number) being arranged transversely in each block, and second grooves being formed in the conductive layer between adjacent light-emitting portions such that the second grooves are arranged short and long alternately, with the nearest one to the first groove being short.

In the light-emitting diode array of the present invention, the first rectangular groove surrounding each block preferably comprises a groove portion on the side of the first electrodes, a groove portion on the side of the second electrode, and a pair of groove portions separating adjacent blocks.

The second grooves are preferably connected to the groove portion on the side of the first electrodes in a comb shape.

The second short grooves preferably extend to a boundary between the light-extracting portion and the first electrode of the light-emitting portion.

The second long grooves preferably extend at least substantially to ends (on the side of the second electrodes) of the light-emitting portions.

When the number of the common wirings is n, the ratio of the number of the first bonding pads to that of the second bonding pads is preferably 1:n. The first and second bonding pads are preferably formed on separate bonding portions formed like islands on the conductive layer, and the light-emitting portions and the bonding portions are preferably separated by mesa-etched grooves.

BRIEF DESCRIPTION OF THE DRAWINGS

FIG. 5(*b*) is an enlarged cross-sectional view taken along the line B—B in FIG. 2;

FIG. 6(*b*) is a graph showing a driving voltage of each light-emitting portion in the block shown in FIG. 3;

FIG. 7 is a top view showing the light-emitting diode array of Japanese patent application No. 2003-289909 (U.S. Ser. No. 10/910,658);

FIG. 9(*b*) is a cross-sectional view taken along the line D—D in FIG. 8;

FIG. 9(*c*) is a cross-sectional view taken along the line E—E in FIG. 8;

FIG. 12(*b*) is a graph showing the relation between an electrode structure and a driving voltage in the light-emitting diode array of Japanese patent application No. 2003-289909 (U.S. Ser. No. 10/910,658);

FIG. 13(*b*) is a graph showing a driving voltage of each light-emitting portion in FIG. 10.

DESCRIPTION OF THE PREFERRED EMBODIMENTS

[1] Structure of Light-Emitting Diode Array

Figure 9A:
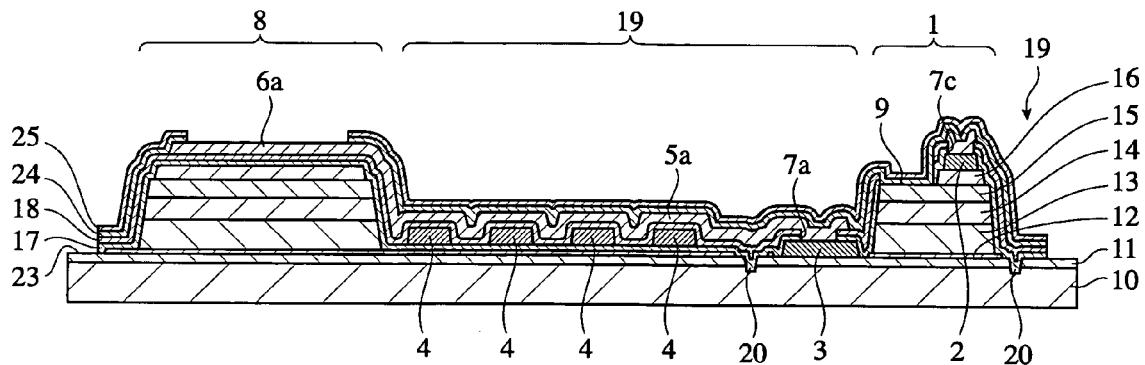
FIG. 9(*a*) is a cross-sectional view taken along the line C—C in FIG. 8.
Figure 9B:
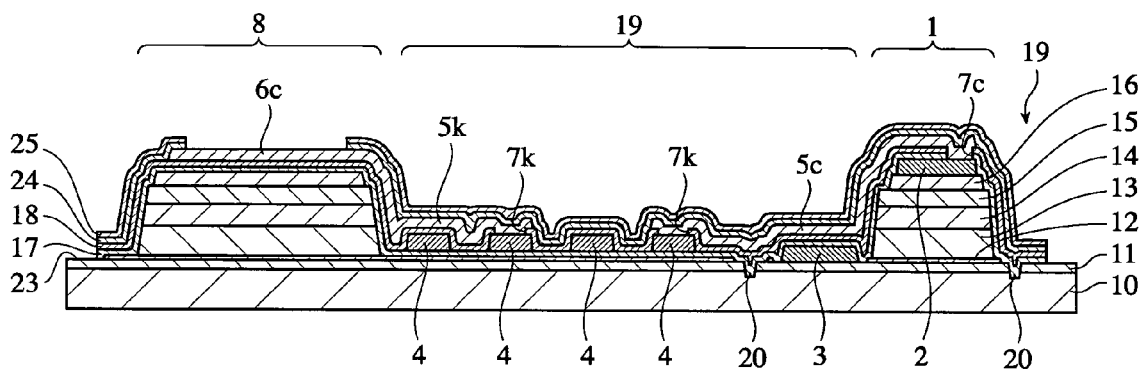
Figure 9C:
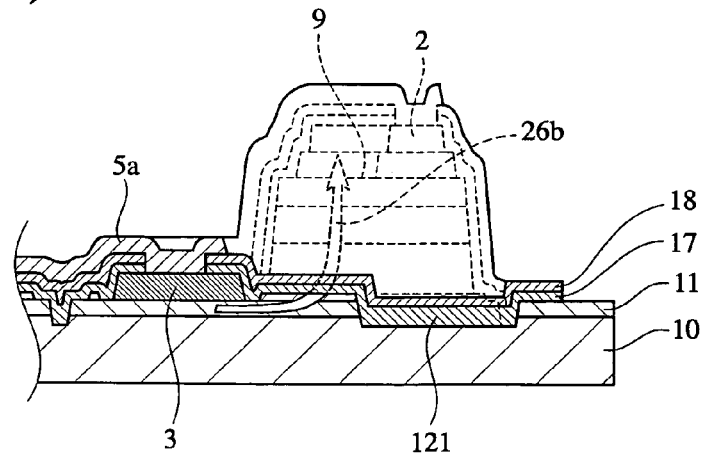
Figure 10:
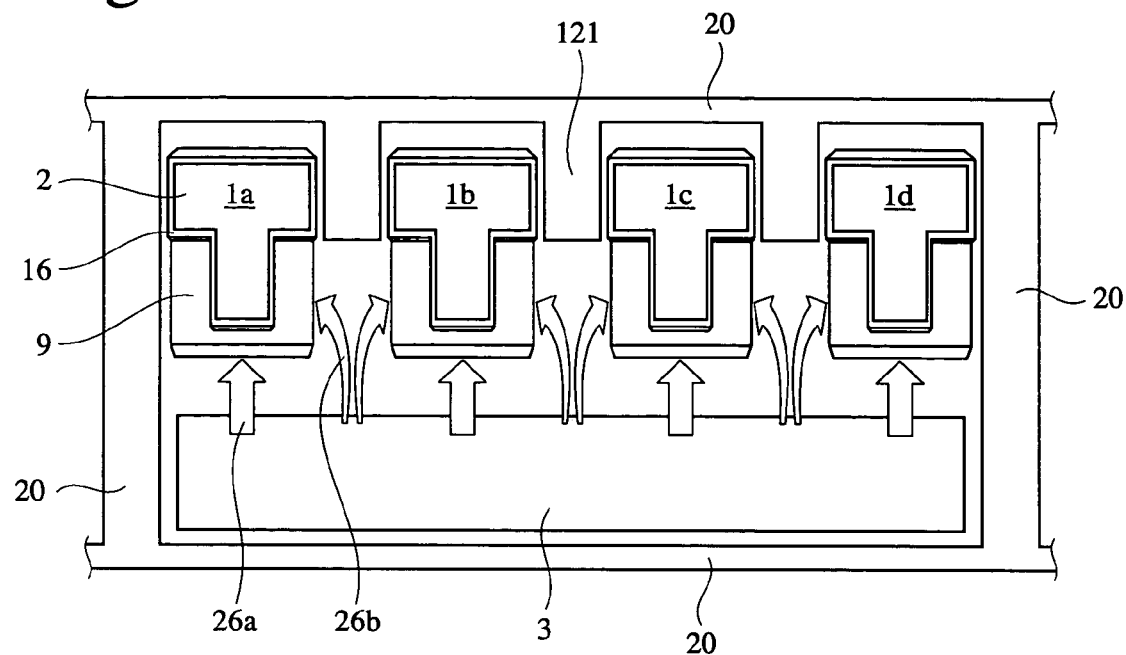
FIG. 10 is an enlarged view showing part of the light-emitting diode array shown in FIG. 7.
Figure 11:
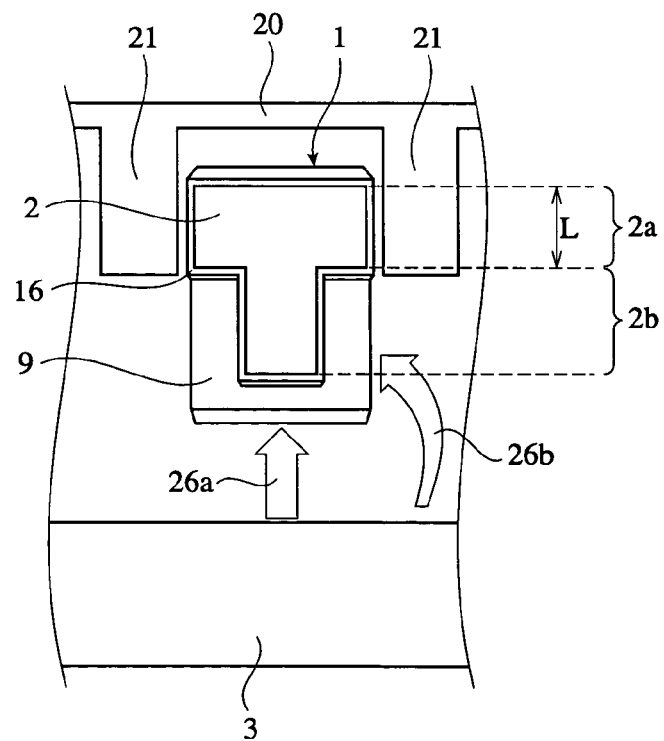
FIG. 11 is an enlarged view showing part of the light-emitting diode array shown in FIG. 10.
Figure 12A:
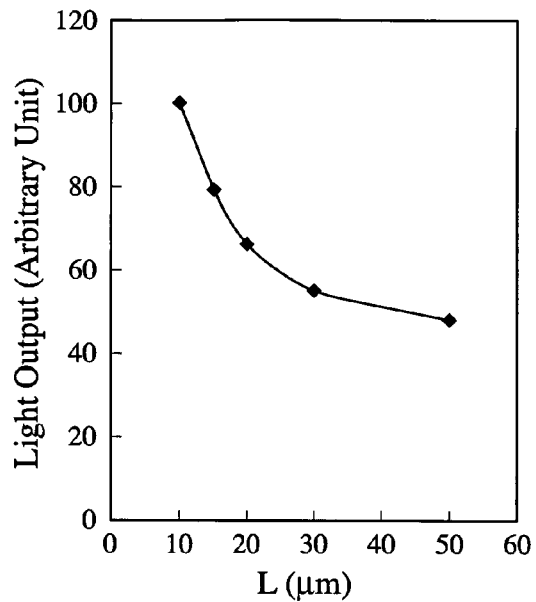
FIG. 12(*a*) is a graph showing the relation between an electrode structure and a light output in the light-emitting diode array of Japanese patent application No. 2003-289909 (U.S. Ser. No. 10/910,658)
Figure 12B:
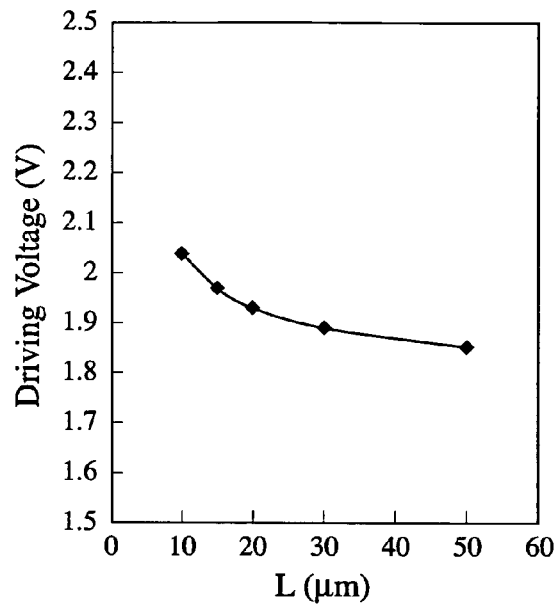

The light-emitting diode array of the present invention will be explained in detail referring to FIGS. 1 to 6, in which the same reference numerals are assigned to the same members as those in the light-emitting diode array shown in FIGS. 7 to 11 unless otherwise particularly mentioned. The cross-sectional structure of the light-emitting diode array of the present invention itself is the same as shown in FIG. 9 except for the second grooves 21 in the conductive layer 11. An insulating layer is omitted in the top view for the simplification of explanation.

Figure 1:
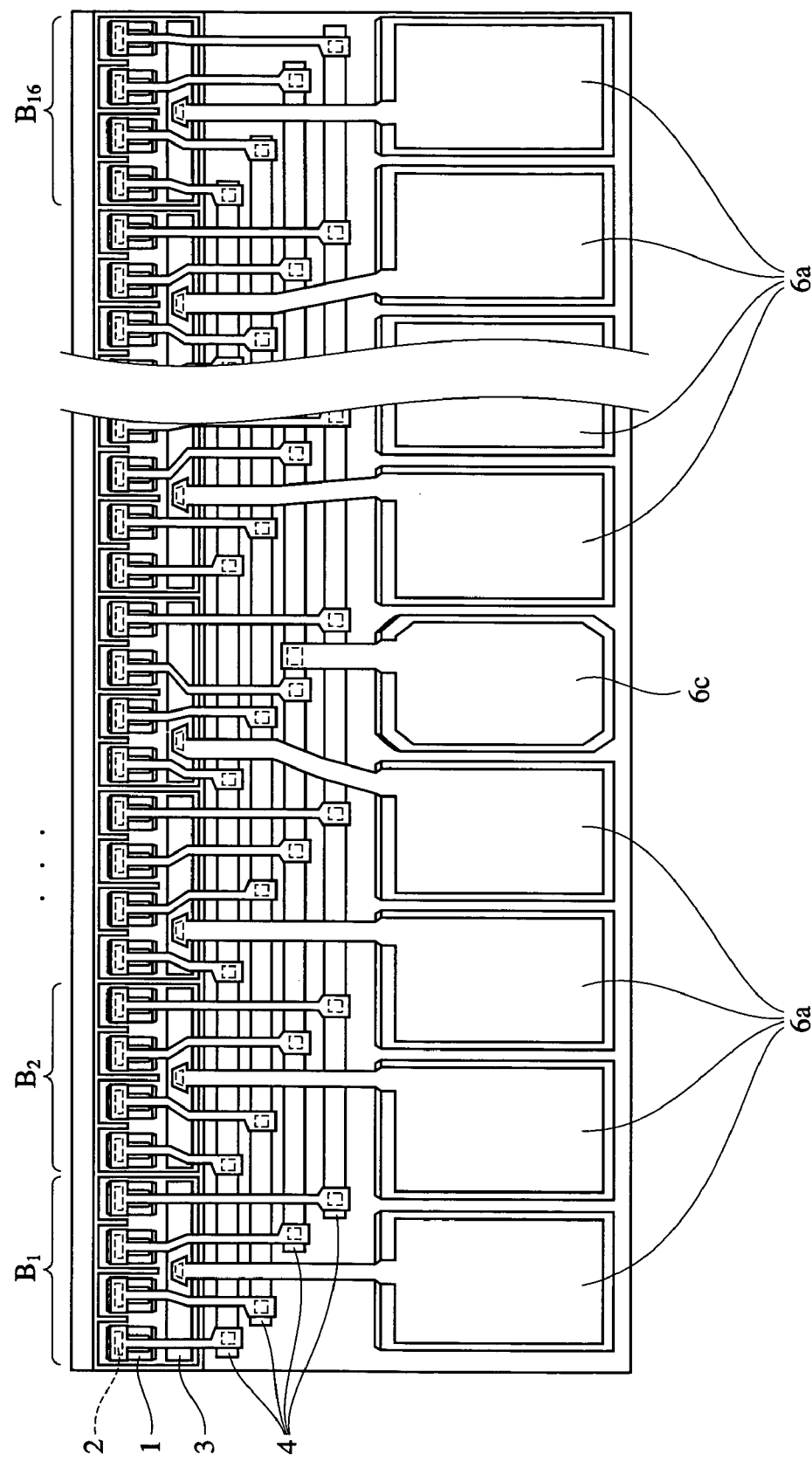
FIG. 1 is a top view showing one cell of the light-emitting diode array according to one embodiment of the present invention.
Figure 2:
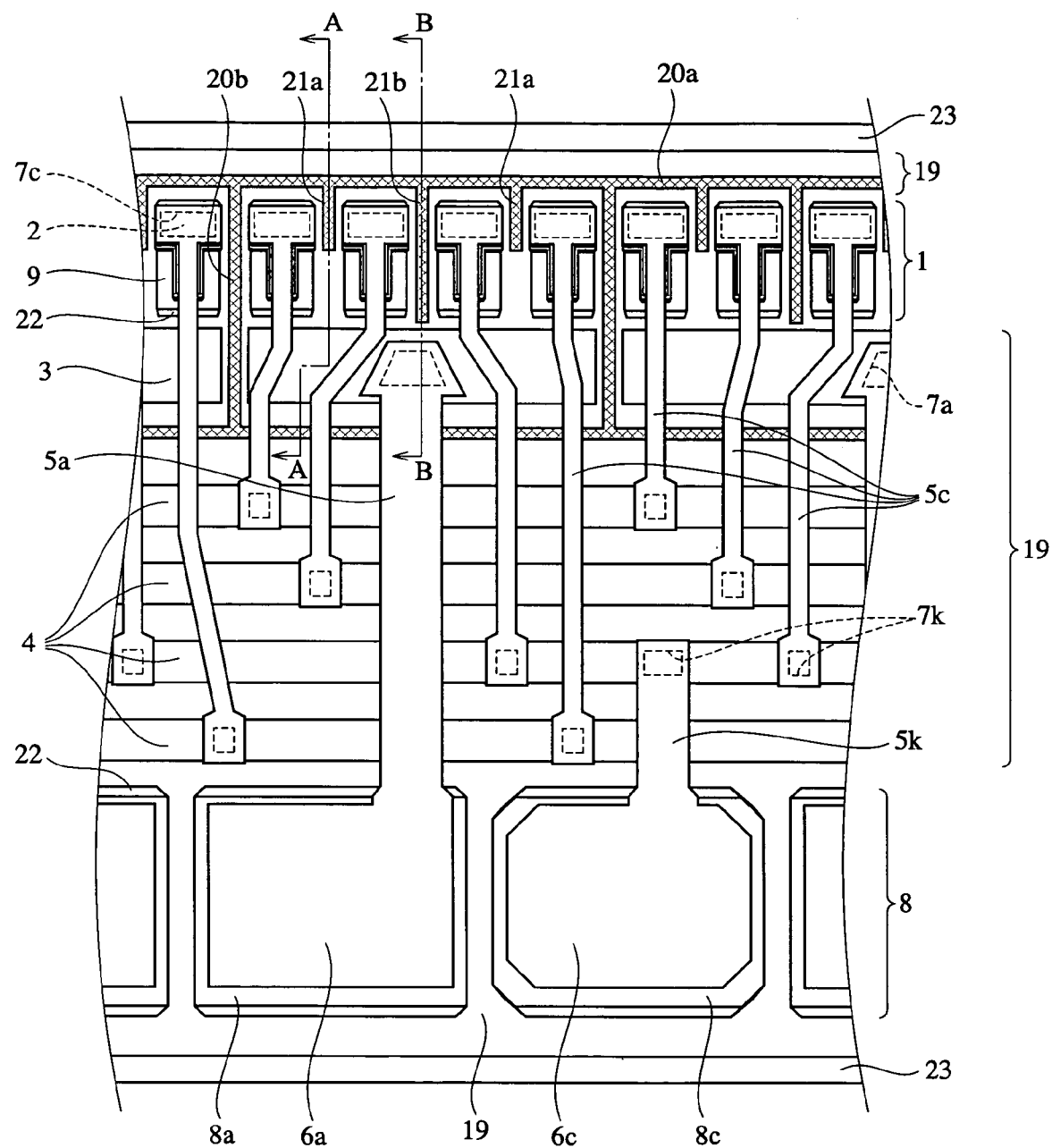
FIG. 2 is an enlarged top view showing part of the light-emitting diode array shown in FIG. 1.

FIG. 1 is a top view entirely showing a cell of a light-emitting diode array of four-part matrix according to one preferred embodiment of the present invention, and FIG. 2 is an enlarged top view showing part of the light-emitting diode array shown in FIG. 1.

In the illustrated embodiment, a cell has 16 blocks $B_1$, $B_2$, . . . , $B_{16}$, each of which comprises four light-emitting portions 1. Accordingly, a cell is composed of 64 dots of the light-emitting portions 1. This light-emitting diode array comprises four first electrodes (cathodes) 2 each formed in a T shape on each light-emitting portion 1, four common switching wirings 4 each connected to the cathode 2 on each light-emitting portion 1, a second electrode (anode) 3 disposed in each block, four bonding pads 6*c* each connected to each of the common wirings 4, and bonding pads 6*a* (16 in total) connected to the anode 3 in each block. The ratio of the number of the bonding pads 6*c* to that of the bonding pads 6*a* is 1:4. This structure makes it possible to arrange the bonding pads 6a, 6c with an enough margin in width, for instance, 60 μm, in the longitudinal direction of the light-emitting diode array.

Four light-emitting portions 1 surrounded by the first rectangular groove 20 formed in the conductive layer 11 and bonding portions 8a, 8c each having a bonding pad 6a, 6c are separated by the mesa-etched grooves 19. Each light-emitting portion 1 is constituted by an epitaxial layer formed on the substrate 10. Common switching wirings 4 are formed between the bonding portions 8a, 8c and the first groove 20.

Figure 3:
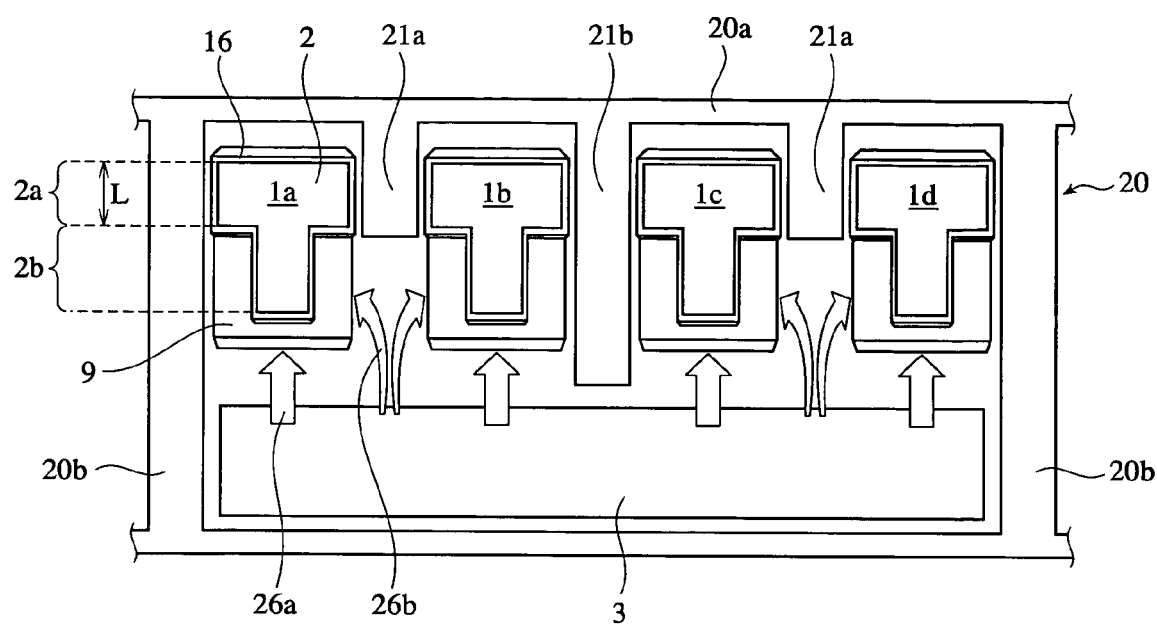
FIG. 3 is an enlarged top view showing part of the light-emitting diode array shown in FIG. 2.

FIG. 3 is a top view showing one block of the light-emitting diode array shown in FIG. 2. Each block $B_1$, $B_2$, ..., $B_{16}$ comprises four light-emitting portions 1, a first rectangular groove 20 surrounding the light-emitting portions 1, the second grooves 21 extending from a side portion 20a (on the farthest side from the anode 3) of the first groove 20 between the adjacent light-emitting portions 1, and an anode 3 formed on a conductive layer 11 at a position close to the light-emitting portions 1. Each light-emitting portion 1 has a light-extracting portion 9 on the top surface other than the cathode 2. The anode 3 is disposed at a position close to the light-extracting portions 9.

The first and second grooves 20, 21 are preferably mesa-etched grooves formed by completely removing the conductive layer 11. The first groove 20 electrically insulates the adjacent blocks from each other, and the second grooves 21 control current flowing between the adjacent light-emitting portions 1.

In the light-emitting diode array of the present invention, the second grooves 21a, 21b extending from a side portion 20a of the first groove 20 have different length. Specifically, second short grooves 21a extend between the light-emitting portions 1a, 1d close to portions 20b of the first grooves 20 separating the adjacent blocks, and the light-emitting portions 1b, 1c not close to the groove portions 20b, and a second long groove 21b extends between the light-emitting portions 1b, 1c. The second short grooves 21a preferably extend substantially to ends (on the farthest side from the anode 3) of the light-extracting portions 9 like those in FIGS. 7 to 9, and the long groove 21b preferably extends at least substantially to ends (on the side of the anode 3) of the light-extracting portions 9. However, the length of the second long groove 21b may be properly adjusted to make the light output uniform.

Figure 4:
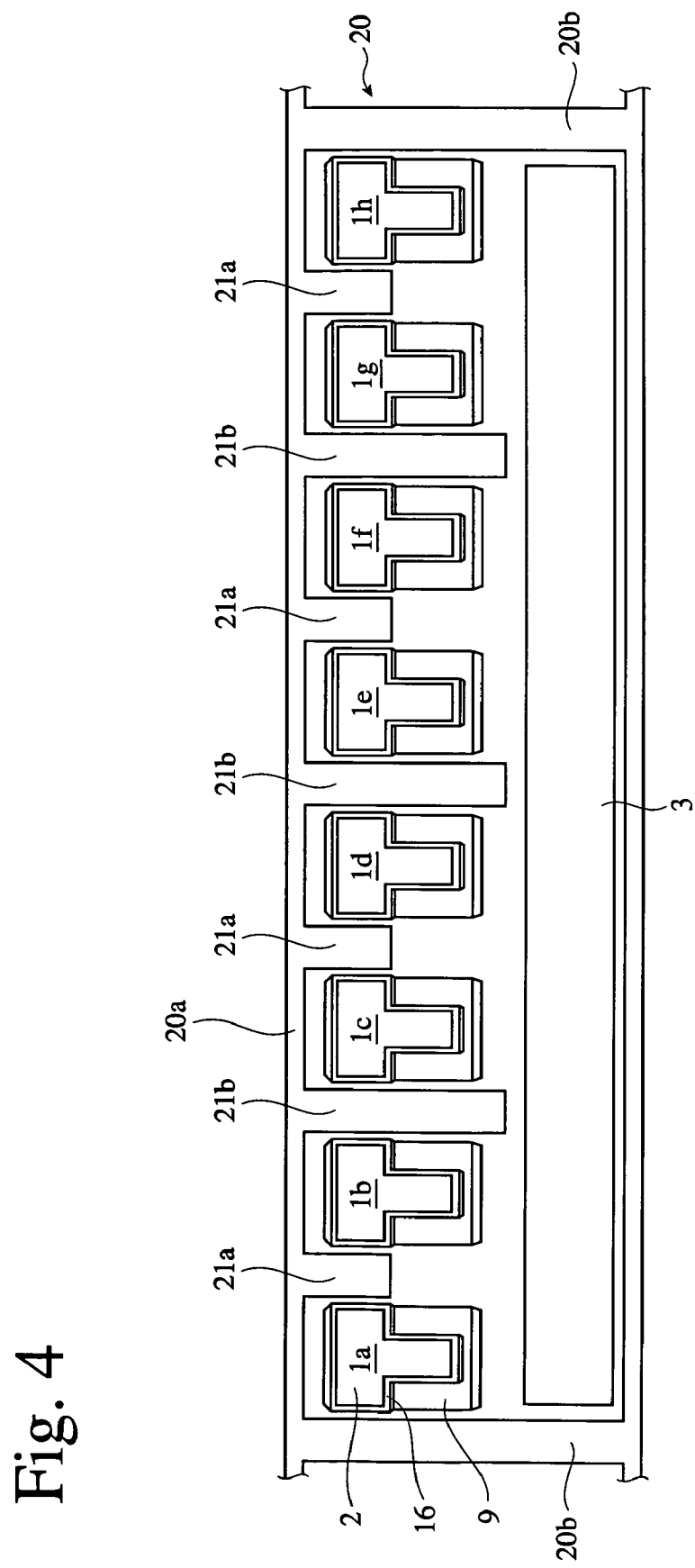
FIG. 4 is a top view showing one block of the light-emitting diode array according to another embodiment of the present invention.

FIG. 4 shows one block of a light-emitting diode array of an 8×8 matrix. In this example, the second grooves 21a respectively adjacent to the light-emitting portions 1a and 1h close to the groove portions 20b are short, the second grooves 21b next to the second grooves 21a are long, and the second grooves 21a next to the second grooves 21b are short. Accordingly, the second grooves 21 are short, long, short, long, short, long and short.

When one block comprises n light-emitting portions, wherein n represents an even number, (n–1) second grooves 21 are arranged short, long, short, long, ..., short from the side of the first groove 20.

Figure 5A:
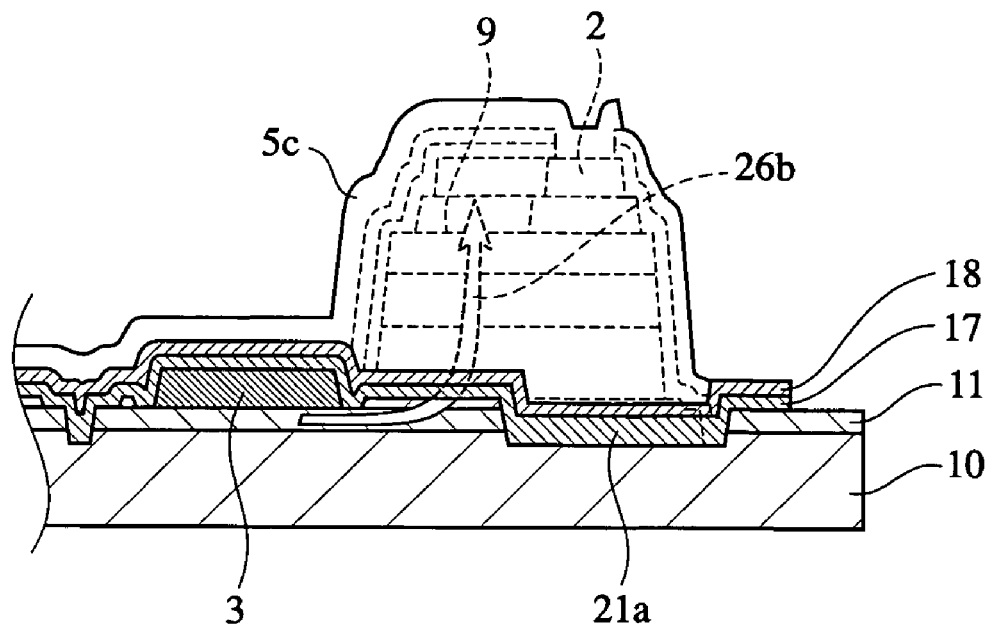
FIG. 5(*a*) is an enlarged cross-sectional view taken along the line A—A in FIG. 2.
Figure 5B:
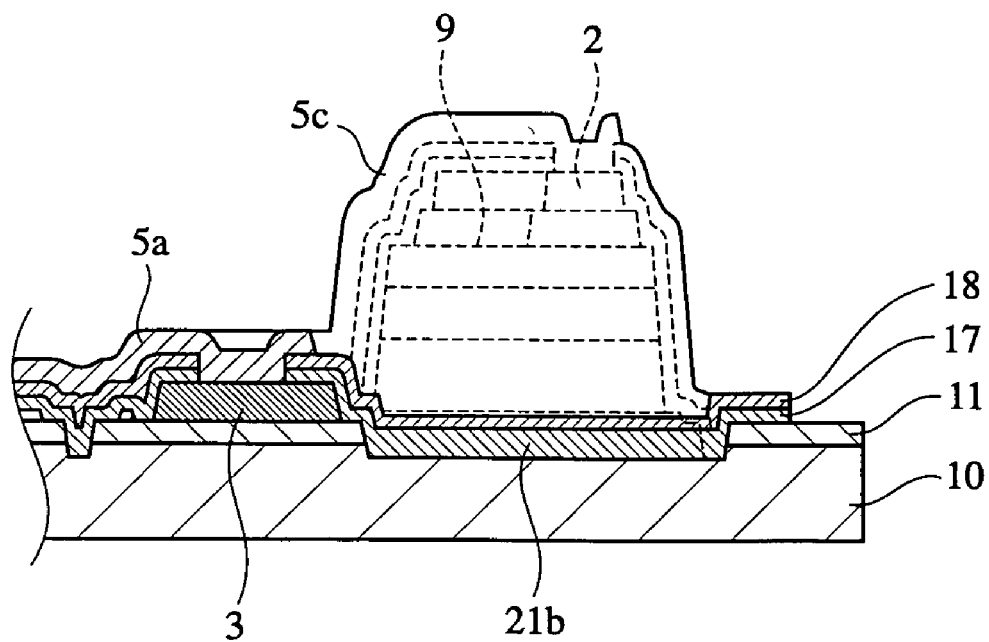
Figure 6A:
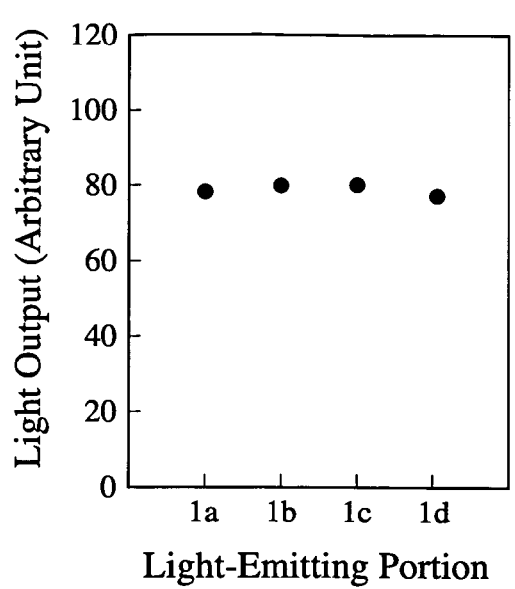
FIG. 6(*a*) is a graph showing a light output of each light-emitting portion in the block shown in FIG. 3.
Figure 6B:
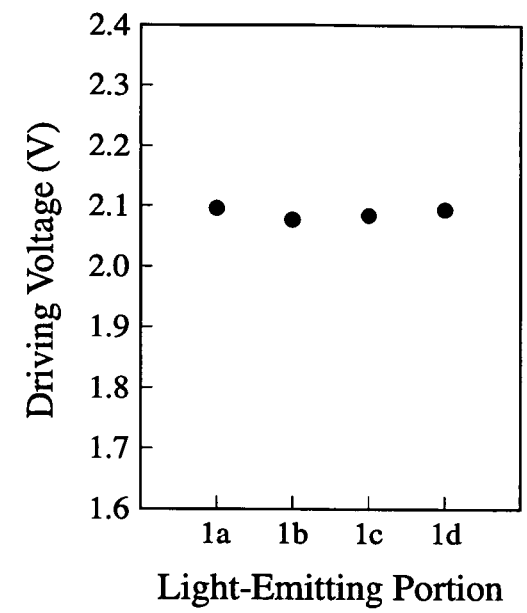
Figure 8:
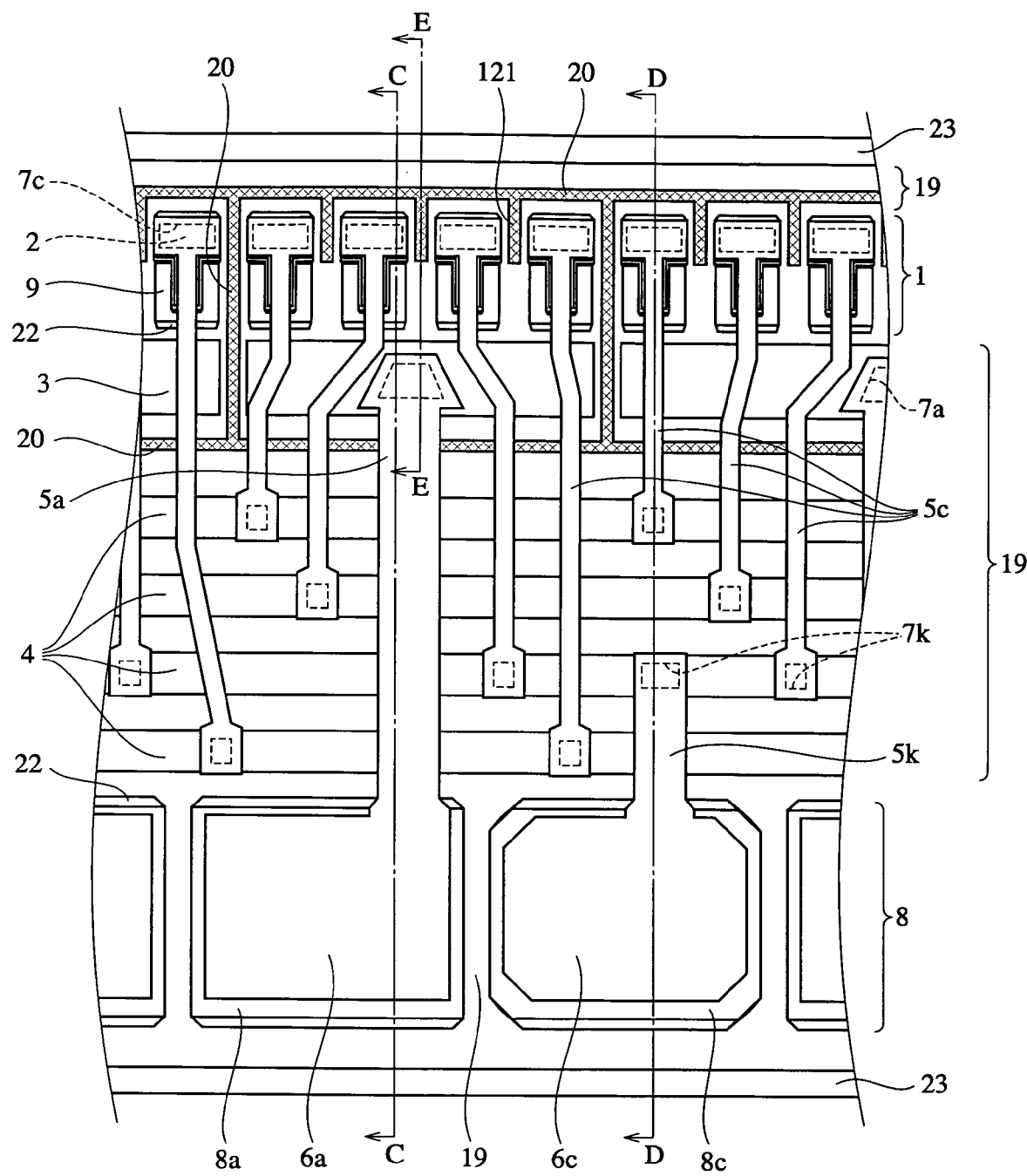
FIG. 8 is an enlarged view showing part of the light-emitting diode array shown in FIG. 7.
Figure 13A:
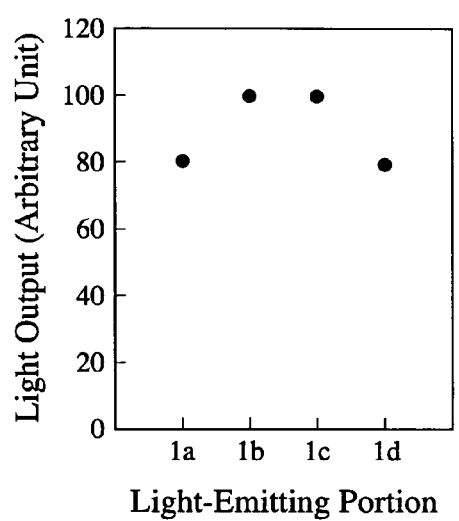
FIG. 13(*a*) is a graph showing a light output of each light-emitting portion in FIG. 10.
Figure 13B:
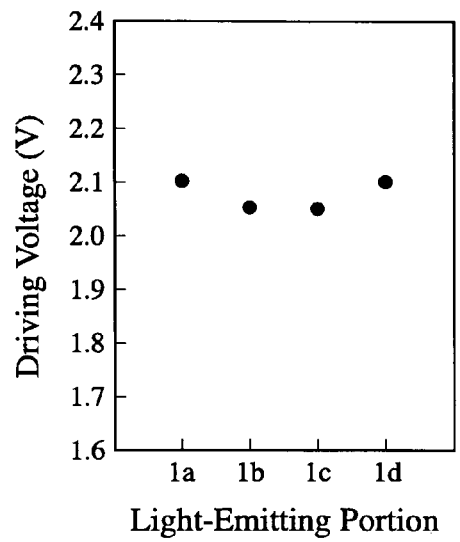

FIGS. 5(a) and 5(b) are cross-sectional views taken along the lines A—A and B—B, respectively, in FIG. 2. The third and fourth insulating layers 24, are omitted for the clarification of the structure in FIGS. 5(a) and 5(b). As shown in FIG. 5(a), sneak current 26b flows into the light-emitting portion 1 because of the second short groove 21a adjacent to the light-emitting portion 1 nearest to the first groove 20. On the other hand, as shown in FIG. 5(b), sneak current among current flowing from the anode 3 to the cathode 2 is substantially prevented from entering the light-emitting portion 1, because the second long groove 21b adjacent to the light-emitting portions 1 far from the first groove 20 extends close to the anode 3. Thus, as shown in FIG. 3, sneak current 26b flows into each light-emitting portion 1 in a region having the second short groove 21a, while sneak current 26b does not substantially flow into each light-emitting portion 1 in a region having the second long groove 21b. Because substantially the same amount of sneak current 26b flows into each light-emitting portion 1a, 1b, 1c, 1d, each light-emitting portion 1a, 1b, 1c, 1d has uniform light output and driving voltage in each block. FIGS. 6(a) and 6(b) show a light output and a driving voltage in each light-emitting portion 1a, 1b, 1c, 1d in the light-emitting diode array in this example. The comparison of FIGS. 6 and 13 reveals that the light output and driving voltage are made remarkably uniform by adjusting the length of the second grooves 21 as described above.

The structure of each part of the light-emitting diode array of the present invention other than the first and second grooves 20, 21 will be explained below in detail.

(1) Substrate and Conductive Layer

The substrate 10 may be a conductive or semiconductive substrate that can be used for light-emitting diodes. Either of an n-type substrate and a p-type substrate may be used. In the case of a semiconductive substrate, for instance, an n-type GaAs substrate, etc. may be used. The substrate 10 may be insulated from the conductive layer 11 with a high-resistivity layer such as an undoped GaAs layer formed therebetween, or with a semiconductor layer opposite in polarity to the conductive layer 11 formed therebetween. In the case of the n-type GaAs substrate 10, the conductive layer 11 is preferably a p-type GaAs.

(2) Light-Emitting Portion

The light-emitting portion 1 may have the same structure as shown in FIG. 9. The type and thickness of a compound semiconductor crystal layer laminated on the conductive layer 11 may be properly determined depending on the desired light emission wavelength and light-emitting power. Usable as the compound semiconductors are, for instance, AlGaAs, AlGaInP, etc. The light-emitting portion 1 preferably has a double hetero structure comprising a clad layer of a first conductor type, an active layer and a clad layer of a second conductor type. Each light-emitting portion 1 may be formed by separating an epitaxial layer formed on the conductive layer 11 by a mesa-etched groove 19.

In the embodiment shown in FIG. 9, the light-emitting portion 1 in the light-emitting diode array comprises an AlGaAs etching-stopper layer 12, a p-type AlGaAs clad layer 13, a p-type AlGaAs active layer 14, an n-type AlGaAs clad layer 15, and an n-type GaAs cap layer 16, which are successively formed on the p-type GaAs conductive layer 11 on the n-type GaAs substrate 10. The n-type GaAs cap layer 16 in the light-extracting portion 9 is removed by etching.

An area directly associated with light emission in the light-emitting portion 1 has a double-hetero structure in which the p-type AlGaAs active layer 14 having an energy band gap corresponding to the light-emitting wavelength is sandwiched by the p-type AlGaAs clad layer 13 (first-conductive-type clad layer), and the n-type AlGaAs clad layer 15 (second-conductive-type clad layer) both having larger energy band gaps than that of the layer 14.

(3) Insulating Layer

As shown in FIG. 9, the light-emitting portions 1, the bonding portions 8 and the mesa-etched groove 19 are entirely covered with the first insulating layer 17 and the second insulating layer 18. As described below, a third insulating layer 24 and a fourth insulating layer 25 are formed on the electrodes and the wirings except for the bonding pads 6a, 6c.

(4) Electrode and Wiring

One of the first and second electrodes may be a cathode, and the other may be an anode. For example, the first electrodes may be a cathode or an anode. Since each electrode is required to have good bonding characteristics and ohmic connectivity to an underlying layer, it is preferably composed of pluralities of metal layers. For example, the anode may be a laminate electrode of AuZn/Ni/Au, Ti/Pt/Au, etc. and the cathode may be a laminate electrode of AuGe/Ni/Au, etc.

Since the common wirings 4 and the lead wirings 5 should have good bonding characteristics and adhesion to an upper layer and/or a lower layer, they are preferably composed of pluralities of metal layers. The uppermost layer and/or the undermost layer preferably have layers of metals such as Ti, Mo, TiW, etc. having good bonding characteristics. They may have laminate structures such as Ti/Au/Ti, Mo/Au/Mo, TiW/Au/TiW, etc. When the anode 3 and the common wirings 4 are formed simultaneously to simplify the production process, they may be laminates of Ti/Pt/Au/Ti, etc.

In each electrode, the metal layers can be formed by vapor deposition methods such as a resistance-heating vapor deposition method, an electron beam-heating vapor deposition method, etc., and the oxide layer can be formed by various known film-forming methods. A heat treatment (alloying) is preferably performed on the metal layers to make an ohmic electrode.

In the examples shown in FIGS. 1–3 and 9, part of the n-type GaAs cap layer 16 in each light-emitting portion 1 is removed by etching, such that an exposed upper surface of the n-type AlGaAs clad layer 15 constitutes a light-extracting portion 9, and that the remaining upper surface of the n-type GaAs cap layer 16 is covered with the cathode 2 having the same shape for ohmic contact. One anode 3 in direct contact with the conductive layer 11 is disposed in each block. The anode 3 is preferably in a strip shape such that it is close to all light-emitting portions 1 with the same distance. As shown in FIG. 3, the cathode 2 is preferably in a T shape. The details of the T-shaped cathode 2 may be the same as those explained in FIG. 11.

The cathode 2 on each light-emitting portion 1 is connected to each common wiring 4 via a lead wire 5c, and each common wiring 4 is connected to each bonding pad 6c on each bonding portion 8c via a lead wire 5k. Each anode 3 is connected to each bonding pad 6a on each bonding portion 8a via a lead wire 5a.

The lead wires 5a, 5c are respectively connected to the anodes 3 and the cathodes 2 via contact holes 7a, 7c formed by etching the first insulating layer 17 and the second insulating layer 18. The lead wires 5k are connected to the common wirings 4 formed between the first insulating layer 17 and the second insulating layer 18 via contact holes 7k formed by etching the second insulating layer 18.

(5) Mesa-Etched Groove

To form pluralities of separate light-emitting portions 1 and bonding portions 8, namely to separate the light-emitting portions 1 and the bonding portion 8 like islands, a mesa-etched groove 19 is formed to the conductive layer 11 or the etching-stopper layer 12.

The mesa-etched groove 19 may be the same as shown in FIG. 9. Because of the mesa-etched groove 19 between individual bonding portions 8, Au wirings are not short-circuited between the bonding pads. Because the mesa-etched groove 19 between the bonding portions 8 has a relatively small area, dividing the bonding portions 8 like islands does not cause decrease in an etching speed due to a loading effect.

[2] Production Method of Light-Emitting Diode Array

The preferred method for producing the light-emitting diode array of the present invention will be explained referring to FIGS. 1 to 3 and 9. The p-type GaAs conductive layer 11 (carrier concentration=$4\times10^{19}$ cm$^{-3}$, thickness=1 cm), the AlGaAs etching stopper layer 12 (carrier concentration=$3\times10^{19}$ cm$^{-3}$, thickness=0.1 μm), the p-type AlGaAs clad layer 13 (carrier concentration=$1\times10^{18}$ cm$^{-3}$, thickness=1 μm), the p-type AlGaAs active layer 14 (carrier concentration=$1\times10^{18}$ cm$^{-3}$, thickness=1 μm), the n-type AlGaAs clad layer 15 (carrier concentration=$2\times10^{18}$ cm$^{-3}$, thickness=3 μm), and the n-type GaAs cap layer 16 (carrier concentration=$1\times10^{18}$ cm$^{-3}$, thickness=0.5 μm) are first successively grown on the n-type GaAs substrate 10 by a metal organic vapor phase growth (MOVPE) method.

The resultant crystal layers are subjected to selective wet etching. The n-type GaAs cap layer 16 is first removed from the light-emitting portions 1 except for those in contact with the cathodes 2 and the bonding portions 8. At this stage, the light-extracting portions 9 are formed in the light-emitting portions 1. The first mesa-etched groove 19 is then formed to such depth that the etching stopper layer 12 is exposed, to provide the separate light-emitting portions 1 and the separate bonding portions 8 both constituted by the epitaxial layers on the etching-stopper layer 12.

Further formed on the p-type GaAs conductive layer 11 are the first groove 20 for separating the light-emitting portions 1 to blocks and the second grooves 21 extending from one side of the first groove 20 in a comb shape between the light-emitting portions 1. In this case, each of the second grooves 21 is arranged short and long alternately from one end in the longitudinal direction, as shown in FIG. 3. The first and second mesa-etched grooves 20, 21 preferably have such depth that the n-type GaAs substrate 10 is slightly etched, so that no conductive layer 11 remains in areas corresponding to the grooves 20, 21 even though there are etching errors.

The cathodes 2 of AuGe/Ni/Au and the anodes 3 of AuZn/Ni/Au are formed by a vapor deposition method and a lift-off method. Next, the first insulating layer 17 is grown on the entire upper surface of the light-emitting diode array by a chemical vapor deposition (CVD) method. The common wirings 4 of Ti/Au/Ti are formed on the first insulating layer 17 by a vapor deposition method and a lift-off method.

After the second insulating layer 18 is grown on the entire upper surface of the light-emitting diode array by the CVD method, the contact holes 7c, 7a, 7k are formed on the cathodes 2, the anodes 3 and the common electrodes 4. Ti/Au/Ti is sputtered and ion-milled between each contact hole 7c and each contact hole 7k, between each contact hole 7a and each bonding portion 8a, between each contact hole 7k and each bonding portion 8c, and on each bonding portion 8c, 8a, to form the lead wires 5c, 5a, 5k and the bonding pads 6c, 6a both constituted by Ti/Au/Ti.

The first insulating layer 17 and the second insulating layer 18 on the light-extracting portions 9 and the scribe areas 23 are removed by dry etching using a known mixed gas such as CHF$_3$/O$_2$, etc. To prevent moisture, etc. from entering, the third insulating layer 24 and the fourth insulating layer 25 are vapor-deposited to cover the entire upper surface of the light-emitting diode array. Because the fourth insulating layer 25 is final passivation, it is preferably a dense film such as a nitride film, etc. When the third insulating layer 24 and the fourth insulating layer 25 have different refraction indexes, it is necessary to determine their thickness so that they do not act as reflection films at the wavelength of light emitted. Specifically, the total thickness of the third insulating layer 24 and the fourth insulating layer 25 is preferably less than 1 μm as described in JP 2003-031840 A.

Finally, the third insulating layer 24 and the fourth insulating layer 25 on the bonding pads 6 are etched to open bonding windows.

Though the light-emitting diode array shown in FIGS. 1 to 3 has a 4×4 structure with four light-emitting portions in one block and four common electrodes, the light-emitting diode array of the present invention is not restricted to this structure, but may have a 2×2 structure with two light-emitting portions in one block and two common electrodes, or an 8×8 structure (FIG. 4), generally an n×n structure, wherein n is an even number. Though the light-emitting diode array in this embodiment has a resolution of 1200 dpi, for instance, it is of course not restrictive.

The light-emitting diode array of the present invention having the above structure can provide uniform light output at a low driving voltage, because an even amount of sneak current flows into each light-emitting portion in each block of the light-emitting diode array.

What is claimed is:

1. A light-emitting diode array, comprising:
a conductive layer formed on a substrate, pluralities of separate light-emitting portions formed on said conductive layer, a first groove formed in said conductive layer to divide said light-emitting portions to blocks, first electrodes respectively formed on at least part of an upper surface of each of light-emitting portions, one second electrode formed directly on said conductive layer in each of said blocks, common switching wirings respectively connected to said first electrodes, first bonding pads respectively connected to said common switching wirings, and second bonding pads respectively connected to said second electrodes in said blocks, n light-emitting portions (n is an even number) of said pluralities of separate light-emitting portions being arranged transversely in each of said blocks, and second grooves being formed in said conductive layer between adjacent light-emitting portions of said pluralities of separate light-emitting portions such that said second grooves are arranged short and long alternately, with the nearest one of said second grooves to said first groove being short.

2. The light-emitting diode array according to claim 1, wherein said first groove is rectangular-shaped, surrounding each of said blocks, and comprises a first groove portion on the side of said first electrodes, a second groove portion on the side of said second electrode, and a pair of groove portions separating the adjacent blocks;
and wherein said second grooves are connected to said first groove portion on the side of said first electrodes in a comb shape.

3. The light-emitting diode array according to claim 2, wherein the short grooves of said second grooves extend substantially to ends, on the farther side from said second electrode, of light-extracting portions of said light-emitting portions, and wherein the long grooves of said second grooves extend at least substantially to ends, on the side of said second electrodes, of said light-emitting portions.

4. The light-emitting diode array according to any one of claims 1 to 3, wherein the number of said common switching wirings is n, and the ratio of the number of said first bonding pads to that of said second bonding pads is 1:n.

5. The light-emitting diode array according to any one of claims 1 to 3, wherein said first and second bonding pads are formed on separate bonding portions formed like islands on said conductive layer.

6. The light-emitting diode array according to claim 5, wherein said light-emitting portions and said bonding portions are separated by mesa-etched grooves.

* * * * *